US012644916B2

(12) United States Patent
Kooi et al.

(10) Patent No.: US 12,644,916 B2
(45) Date of Patent: Jun. 2, 2026

(54) DIRECT CURRENT—40 GIGAHERTZ COAX-BASED CRYOGENIC VARIABLE TEMPERATURE LOAD (VTL) WITH EXCEPTIONAL TEMPORAL RESPONSE AND LINEARITY

(71) Applicant: California Institute of Technology, Pasadena, CA (US)

(72) Inventors: Jacob W. Kooi, Pasadena, CA (US); Goutam Chattopadhyay, Pasadena, CA (US); Austin Minnich, San Marino, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 129 days.

(21) Appl. No.: 18/632,116

(22) Filed: Apr. 10, 2024

(65) Prior Publication Data

US 2024/0345150 A1 Oct. 17, 2024

Related U.S. Application Data

(60) Provisional application No. 63/458,348, filed on Apr. 10, 2023.

(51) Int. Cl.
| | |
|---|---|
| *G01R 29/26* | (2006.01) |
| *G01K 7/00* | (2006.01) |
| *H01P 3/00* | (2006.01) |
| *H03F 7/00* | (2006.01) |

(52) U.S. Cl.
CPC ............... *G01R 29/26* (2013.01); *G01K 7/00* (2013.01); *H01P 3/003* (2013.01); *H03F 7/00* (2013.01); *H03F 2200/294* (2013.01)

(58) Field of Classification Search
CPC ....... G01L 21/12; H01F 6/06; G01R 33/0354; H01L 2224/48247
See application file for complete search history.

(56) References Cited

U.S. PATENT DOCUMENTS

| | | | | |
|---|---|---|---|---|
| 11,631,927 | B2 * | 4/2023 | Kajbaf | H01P 3/006 |
| | | | | 343/772 |
| 2015/0130554 | A1 * | 5/2015 | Sterns | G01R 27/06 |
| | | | | 324/648 |
| 2020/0341038 | A1 * | 10/2020 | Lexa | H01C 17/006 |

OTHER PUBLICATIONS

Kooi et al., "A Programmable Cryogenic Waveguide Calibration Load With Exceptional Temporal Response and Linearity". IEEE Transactions on Terahertz Science and Technology, vol. 8, No. 4, Jul. 2018, pp. 434-445.

(Continued)

*Primary Examiner* — Huy Q Phan
*Assistant Examiner* — Temilade S Rhodes-Vivour
(74) *Attorney, Agent, or Firm* — GATES & COOPER LLP

(57) ABSTRACT

A variable temperature load (VTL) or noise source including a grounded coplanar waveguide (GCPW) comprising a first metallization patterned on a fused quartz substrate, the first metallization comprising a first end for connecting to a coaxial connector and a second end for connecting to a coplanar waveguide (CPW); the CPW coupled to a 50 ohm termination and comprising a second metallization patterned on a top surface of a crystal quartz substrate; a temperature sensing diode thermally coupled to the crystal quartz substrate and the second metallization; and a heater resistor coupled to the crystal quartz substrate via contact metallization.

20 Claims, 19 Drawing Sheets

(56)                    References Cited

OTHER PUBLICATIONS

Mcgrath et al., "Variable-Temperature Loads for Use Ni-Accurate
Noise Measurements of Cryogenically-Cooled Microwave Ampli-
fiers and Mixers". International Journal of Infrared and Millimeter
Waves, vol. 7, No. 4, 1986, pp. 543-553.

* cited by examiner 1.200″

0.83″

0.700″

50 um Manganin wire (4)

Same (3) Torlon 4203 Posts
as with the WR-10 Vane

Field replaceable
K-connector

Through Hole (#2 screw)

2-56 Helicoil (2)

206

208

202

200

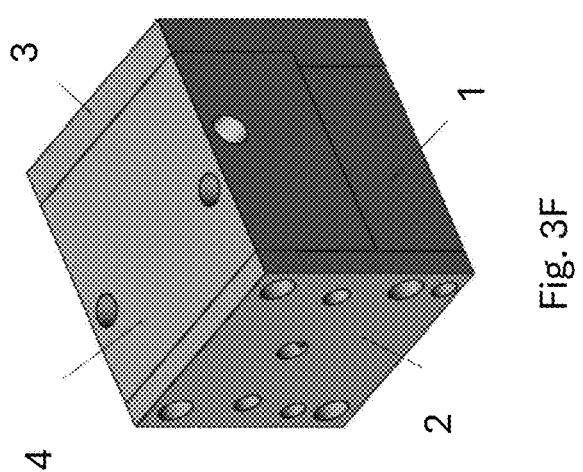
Fig. 3F
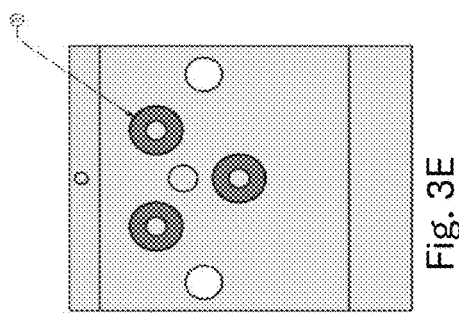
Fig. 3E
Fig. 3B
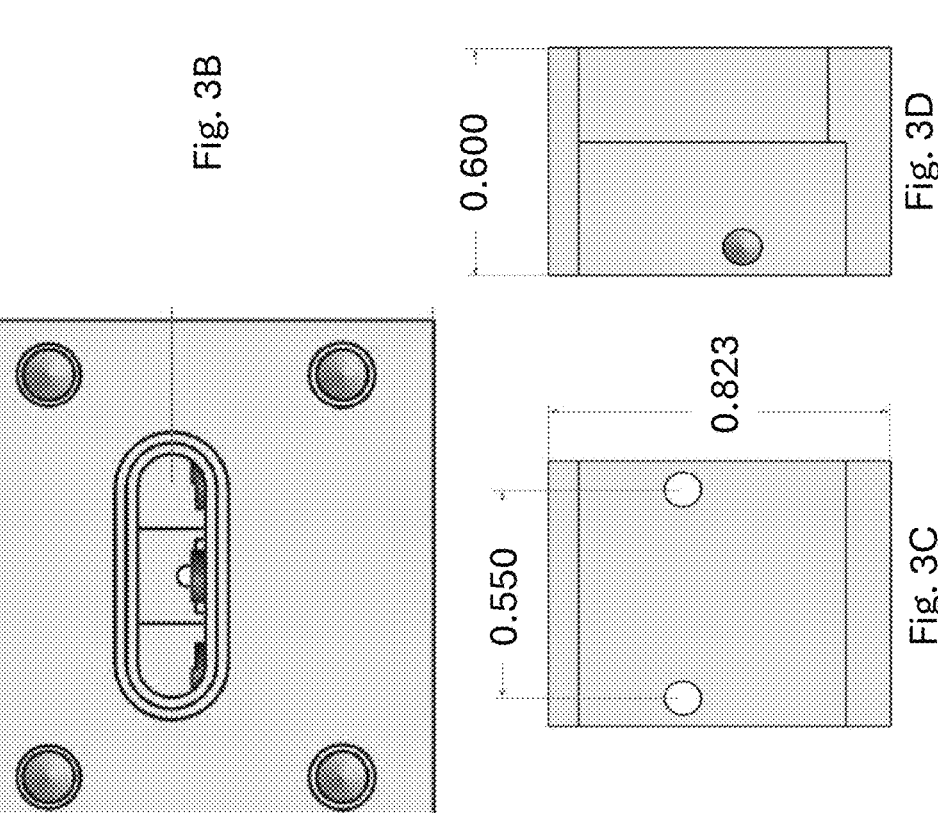
Fig. 3D
0.600
Fig. 3C
0.823
0.550

1

DIRECT CURRENT—40 GIGAHERTZ COAX-BASED CRYOGENIC VARIABLE TEMPERATURE LOAD (VTL) WITH EXCEPTIONAL TEMPORAL RESPONSE AND LINEARITY

CROSS-REFERENCE TO RELATED APPLICATIONS

This application claims the benefit under 35 U.S.C. Section 119(e) of U.S. Provisional Application No. 63/458,348 filed Apr. 10, 2023, by Jacob W. Kooi, Goutam Chattopadhyay, and Austin Minnich, entitled "A DC—40 GHZ COAX-BASED CRYOGENIC VARIABLE TEMPERATURE LOAD (VTL) WITH EXCEPTIONAL TEMPORAL RESPONSE AND LINEARITY," (CIT-8992-P), which application is incorporated by reference herein.

STATEMENT REGARDING FEDERALLY SPONSORED RESEARCH AND DEVELOPMENT

This invention was made with government support under Grant No. 80NMO0018D0004 awarded by NASA (JPL). The government has certain rights in the invention.

BACKGROUND OF THE INVENTION

1. Field of the Invention

The invention relates to a device useful as a noise source or variable temperature load.

2. Description of the Related Art

Cryogenic low noise amplifiers (LNA's) and parametric amplifiers in used in quantum comports and for (DSN) communications require accurate knowledge of the device input referenced added noise. This is often challenging with conventional methods that utilize noise diodes because:
1. The room temperature noise diode excess noise ratio (ENR) is often not better known than 10%.
2. The noise diode output noise signal is then routed into a cryostat via coax lines with poorly known temperature gradients and temperature dependent loss. In a practical system there will be standing waves in the coax transmission line, adding to absolute calibration uncertainly.
3. The noise source signal is typically routed via a 20 dB 'cold attenuator', whose absolute operating temperature is often not better known than 1 Kelvin. This complex path leads to a frequency dependent uncertainty in the device under test (DUT) absolute noise calibration.

What is needed is a noise source or temperature variable load that circumvents all these problems and allows for a more accurate characterization of coax fed devices such as LNA's and parametric amplifiers, or other devices with potential applications in the communication and quantum computer industries. The present disclosure satisfies this need.

SUMMARY OF THE INVENTION

To overcome the problems outlined above, and other problems that will become apparent upon reading the present disclosure, the present invention describes a variable temperature load (VTL) capable of operating in the DC—40 gigahertz (GHz) microwave frequency band and that can use a standard coax input to facilitate seamless integration to coax based devices including, but not limited to, LNA's and parametric amplifiers.

The device converts the input quasi-TEM coax mode to a grounded coplanar waveguide (GCPW) routed to a thermally insulated 50 ohm thin film calibration load.

BRIEF DESCRIPTION OF THE DRAWINGS

Referring now to the drawings in which like reference numbers represent corresponding parts throughout:

FIGS. 3A-3F are views of the walls of the metal housing. Dowel to be pressed after gold plating. All dimensions in inches unless otherwise stated, with tolerance of .xx=+/− 0.03, .xxx of +/−0.010, angular tolerance of +/−0.5 degrees, surface roughness in microinches. All dimensions after gold plating, gold plating buildup does not exceed 3 micrometers.

DETAILED DESCRIPTION OF THE INVENTION

Figure 1A:
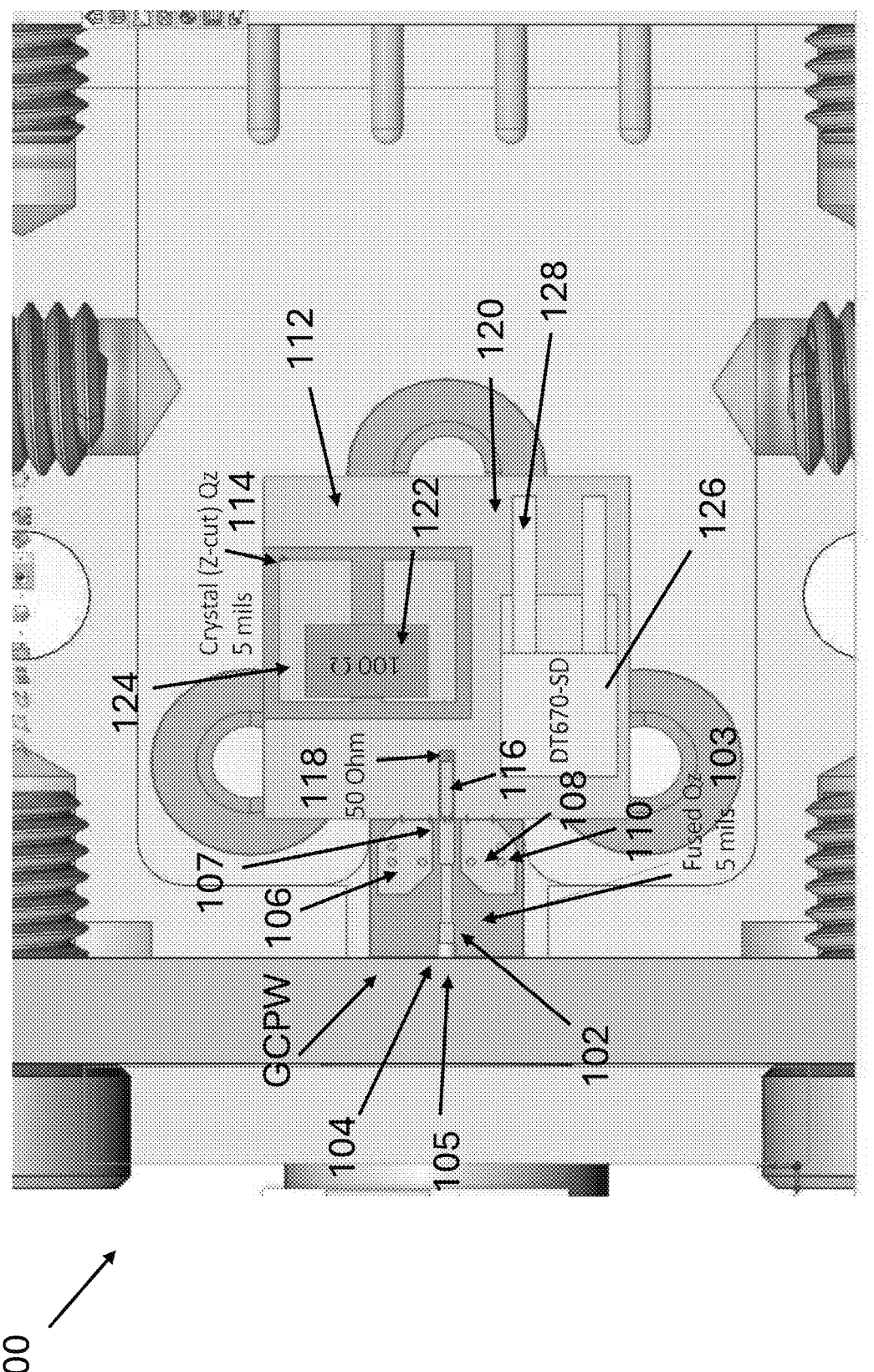
FIG. 1A illustrates a top view of the device showing the grounded coplanar waveguide, the coplanar waveguide, heater resistor, and temperature diode.
Figure 1B:
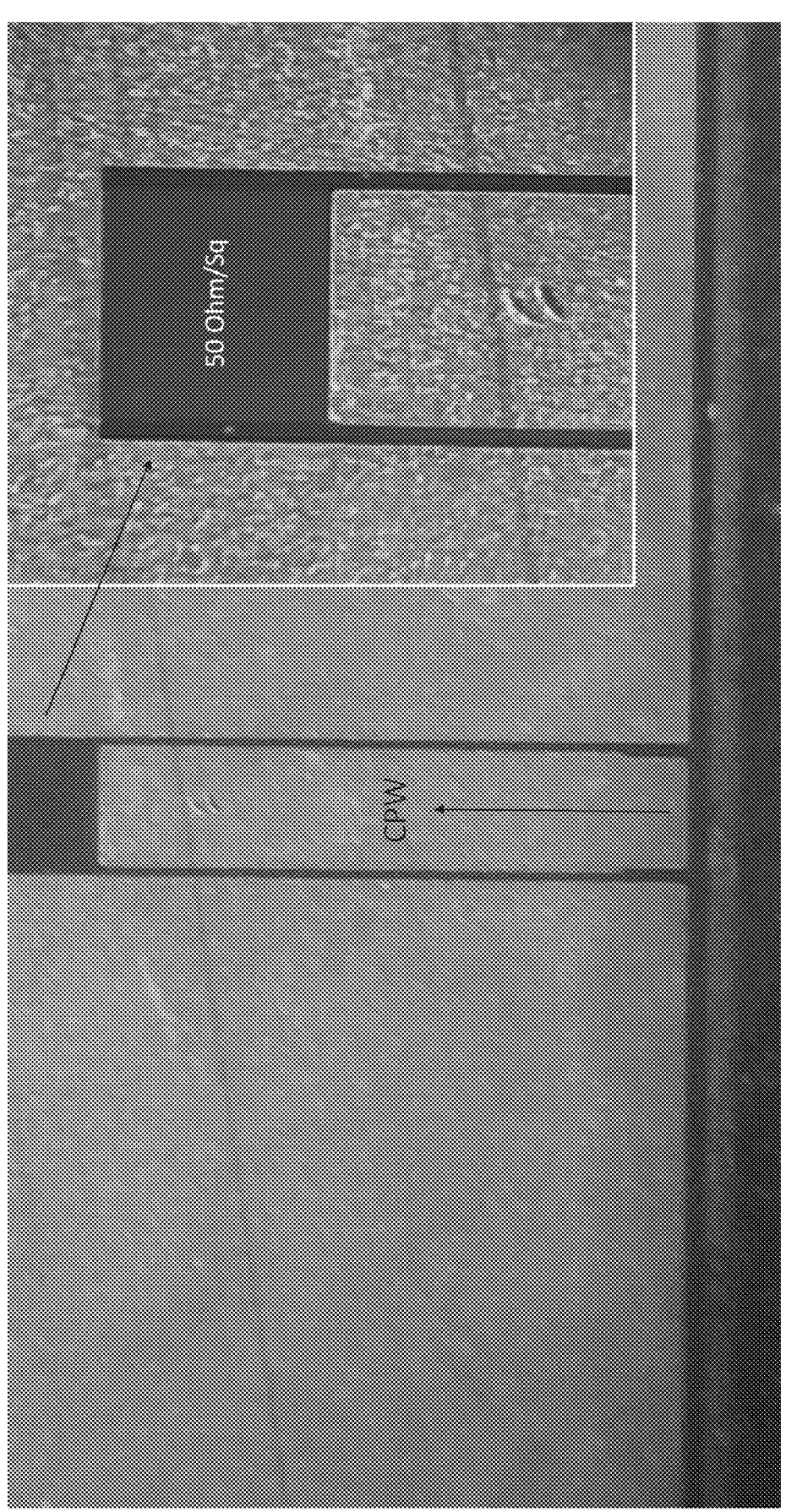
FIG. 1B is close up views of coplanar waveguide and 50 ohm termination.
Figure 1C:
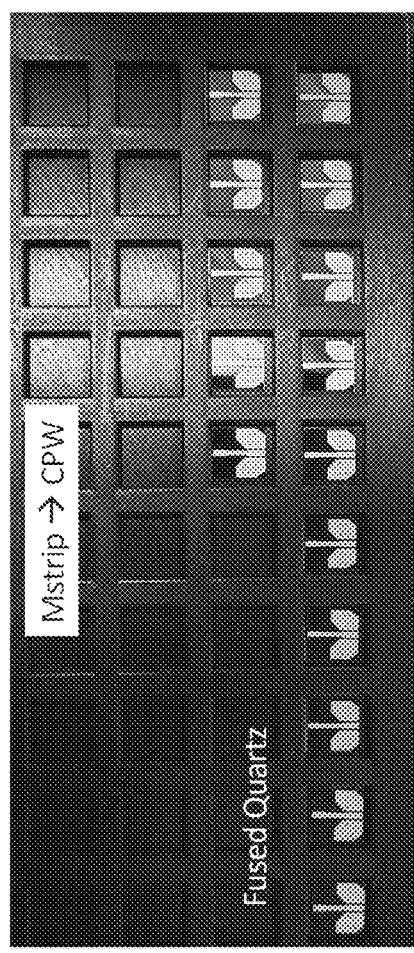
FIG. 1C is a view of the microstrip on fused quartz.
Figure 1F:
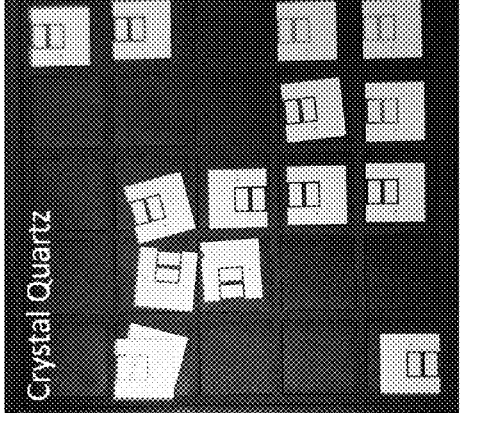
FIGS. 1D-1F are views of the CPW on the crystal quartz at different magnification.
Figure 1E:
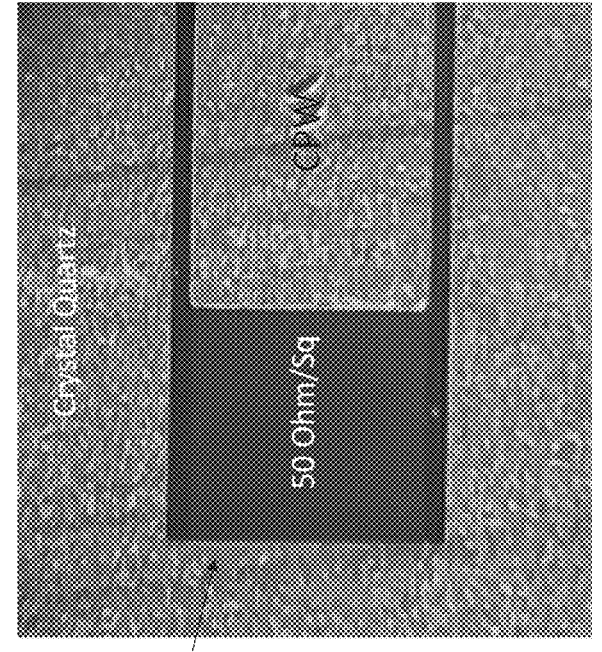
Figure 1D:
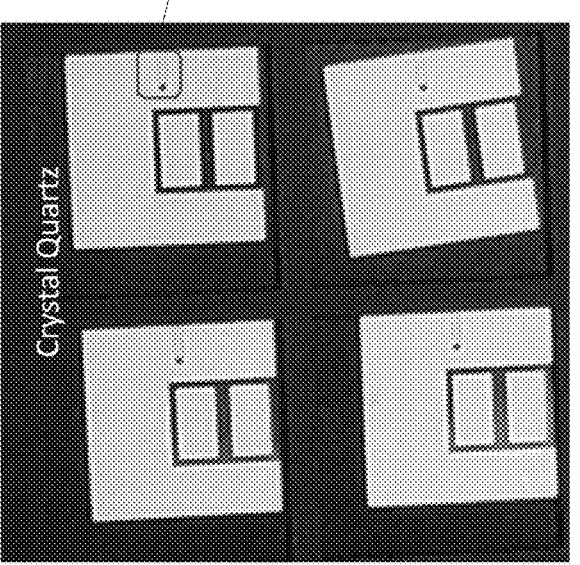
Figure 2A:
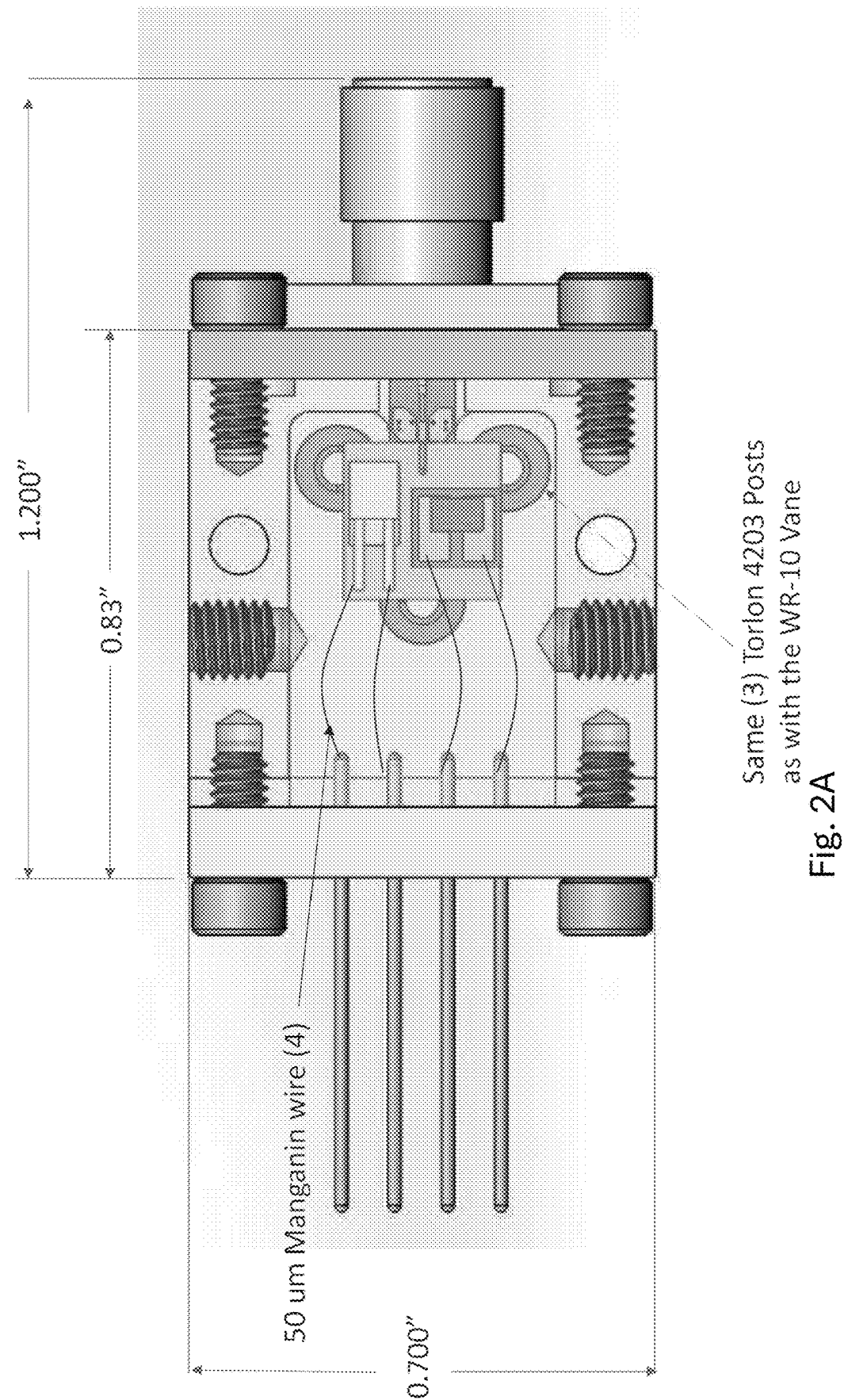
FIGS. 2A-2D are various views of the device mounted in a metal block housing.
Figure 2B:
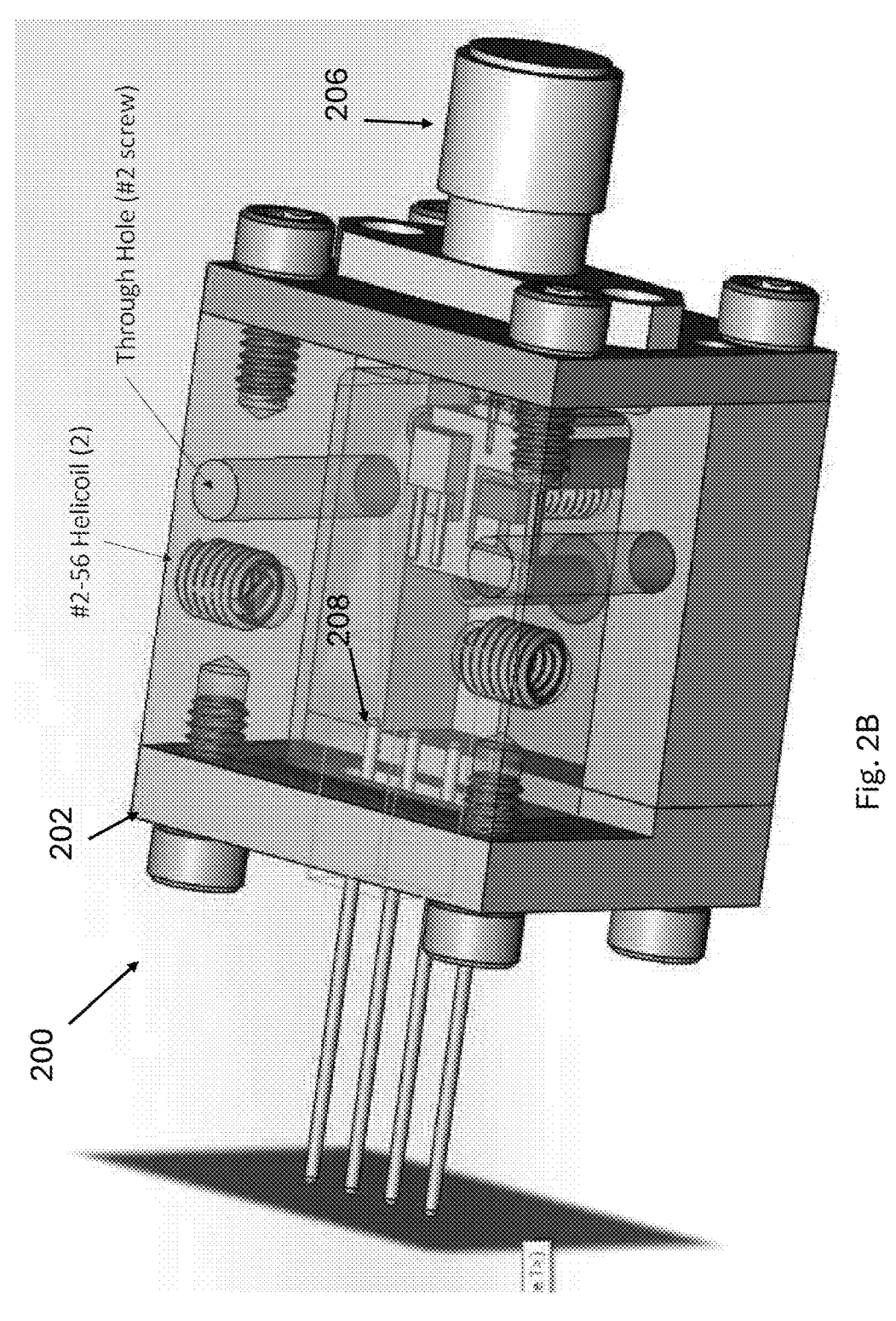
Figure 2C:
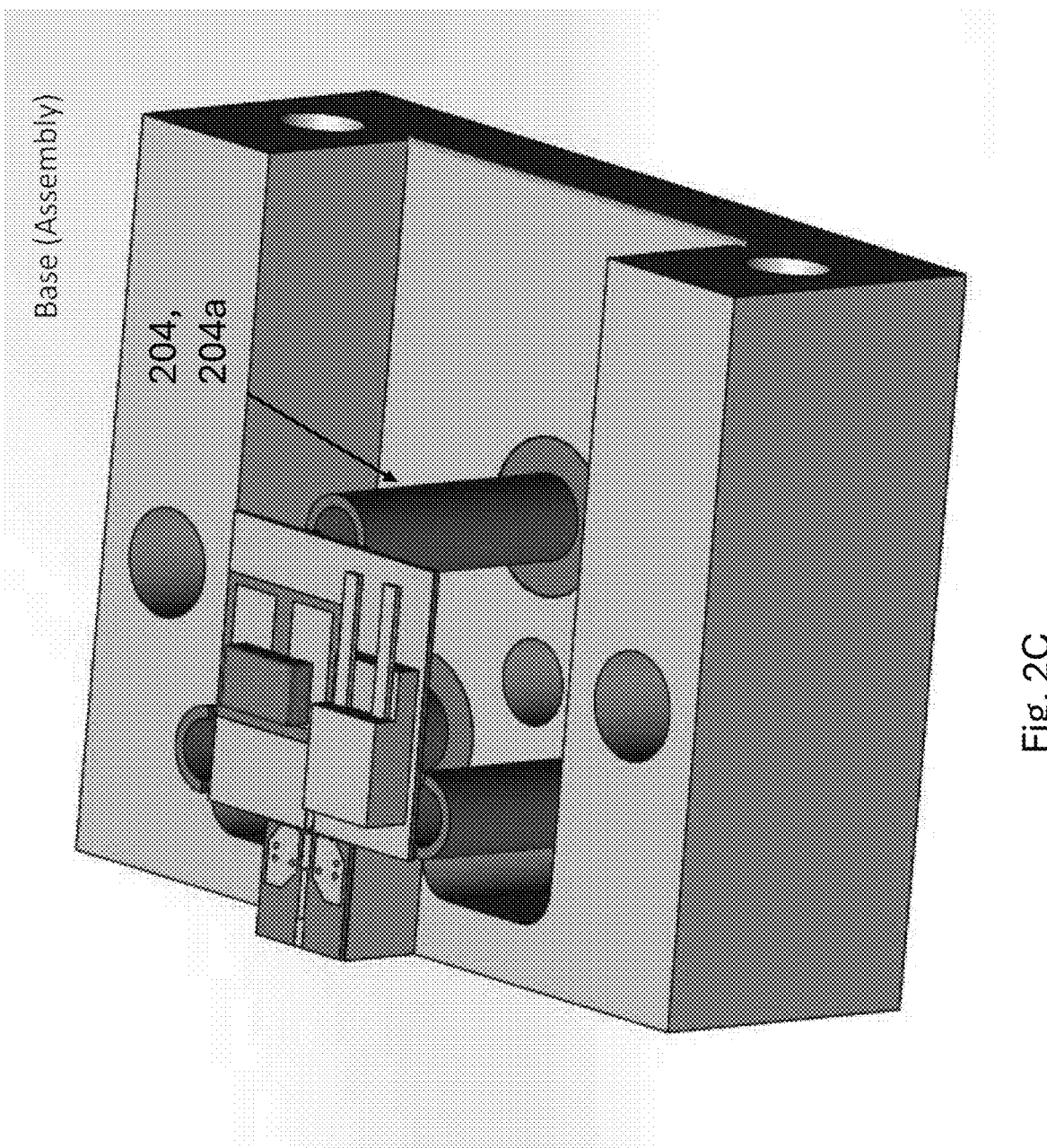
Figure 2D:
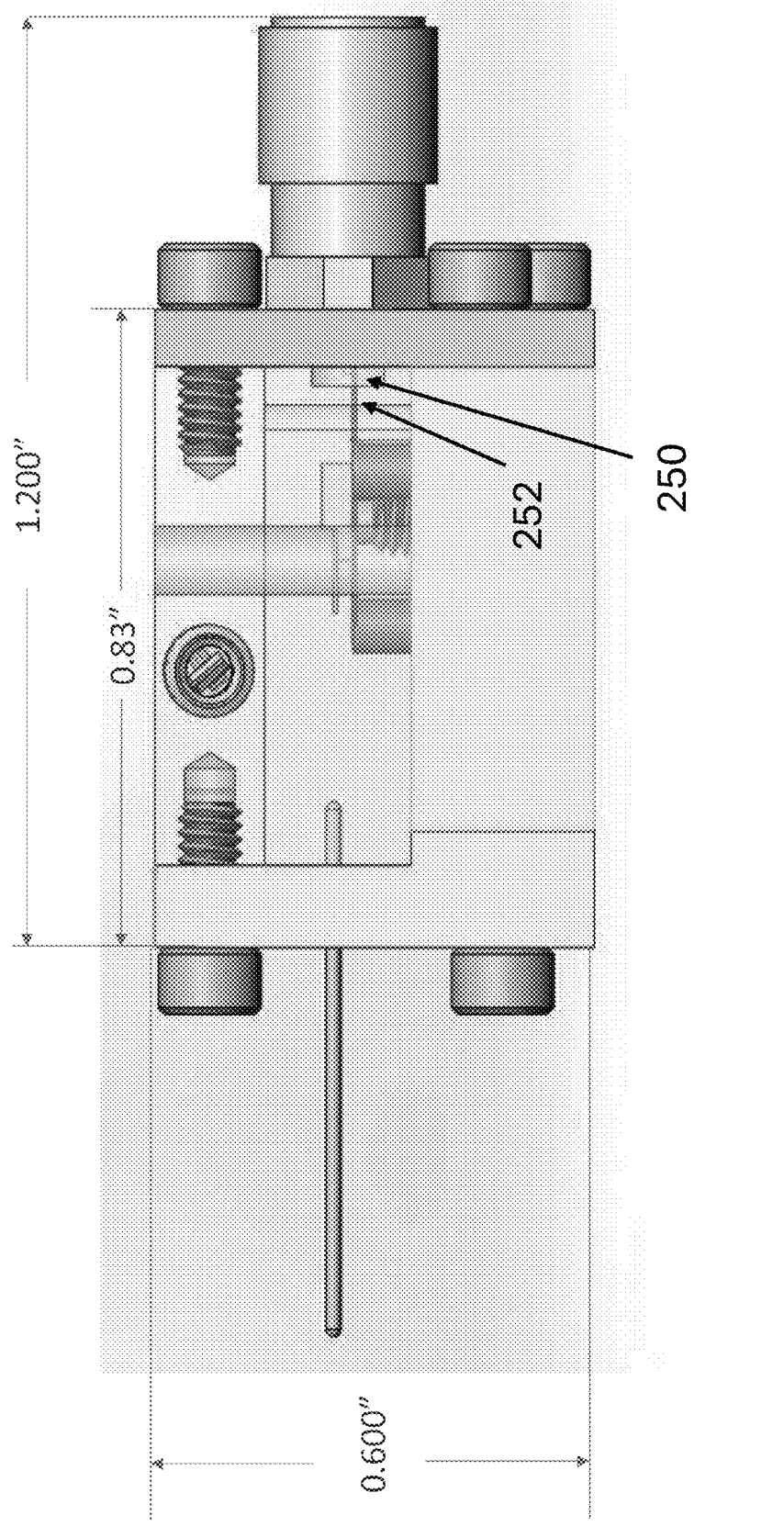
Figure 3A:
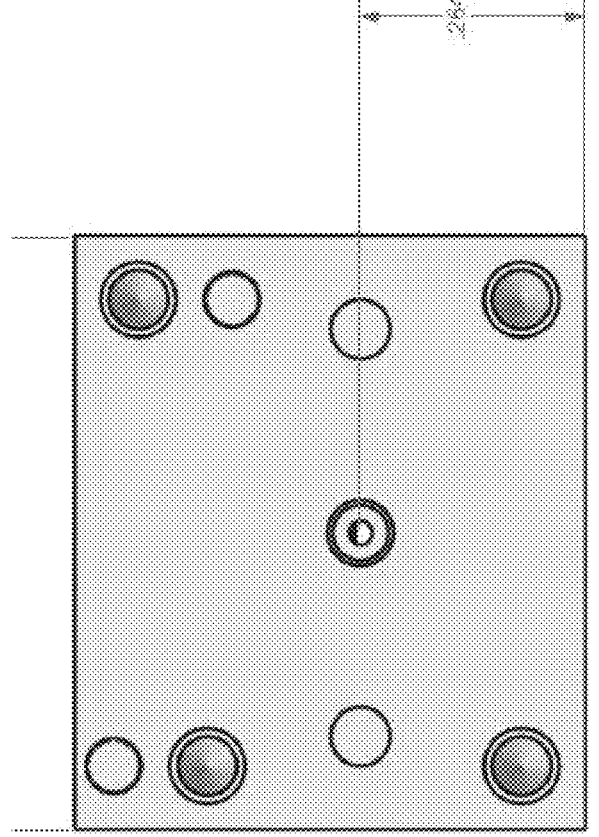

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

FIGS. 1-2 illustrate a temperature programable cryogenic variable temperature load (VTL)/noise source 100 comprising a coaxial connector connected to a load via a coplanar waveguide (CPW) and a grounded coplanar waveguide (GCPW).

FIG. 1 illustrates the GCPW comprises a first metallization 102 (e.g., a gold layer) patterned on a fused quartz substrate 103 (in this example 125 microns thick). The first metallization comprises a first track 104 on a top surface of the fused quartz substrate and having a first end for connecting to the coaxial connector and a second end for connecting to the CPW. The first metallization further comprises a first ground conductor 106 and a second ground conductor 108 on the top surface and on either side of the track; a GCPW ground plane on a base side of the fused quartz substrate for connecting to the outer conductor of the coaxial connector; and vias 110 through the fused quartz substrate electrically for connecting the ground conductors to the GCPW ground plane. This metallization configuration, along with the thick fused quartz, allows for converting the incoming input quasi-TEM coax mode to the GCPW. This also allows connection to the load and at the same time isolates the CPW ground from the chassis.

The CPW coupled to the load (in this example a 50 ohm termination) comprises a second metallization 112 patterned on a top surface of a crystal quartz substrate 114 (in this example, 125 microns thick). The crystal quartz is selected for its excellent thermal conductivity at cryogenic temperatures. The second metallization comprises a second track 116 having one end for electrical connection to the second end of the first track and another end terminating to form the load (e.g., 50 ohm termination 118). The second metallization further comprises a CPW ground plane 120 separated from the second track. The crystal quartz substrate (for the CPW) and the fused quartz substrate (for the GCPW) about each other in close proximity with an air gap that allows for the electrical connection between the first track and the second track. The small air gap prevents direct thermal contact and separates the ground plane of the GCPW and the CPW so they are not in electrical contact.

A heater 122 is electrically coupled to the crystal quartz substrate via contact metallization 124 so as to control the temperature of the load via heating. For the illustrated example, the heater comprises a 50 Ohm 0603 heater resistor thermally anchored to the crystal quartz substrate with thermally conductive Stycast 2850 epoxy.

A temperature sensing diode 126 is thermally coupled to the crystal quartz substrate and the second metallization to enable monitoring of the load's temperature. The diode's leads 128 are electrically connected across two separate locations on the ground plane. For the illustrated example, the diode comprises a DT670-SD Lakeshore temperature diode.

FIG. 2 illustrates the VTL/noise source further comprises a metal housing or chassis 200 housing the GCPW, the CPW, the diode, and the heater. The GCPW ground plane is electrically coupled to (and sits on) the metal chassis 202 of the metal housing. A thermal insulation 204 thermally decouples the crystal quartz substrate from the metal housing. In the example shown, the thermal insulation comprises three stand off posts supporting the crystal quartz substrate on a base of the housing, wherein the standoff posts consist essentially of Torlon 4203 or polyamide-imide.

The coaxial connector 206 is mounted to the metal housing and is coupled with its inner conductor connected to the first end of the first track (of the GPW) and its outer conductor connected to the GCPW ground plane via the chassis of the housing.

FIG. 2 further illustrates a connector 208 comprising a first pair of terminals wired to the diode and a second pair of the terminals wired to the heater resistor.

Device Experimental Characterization

Figure 4:
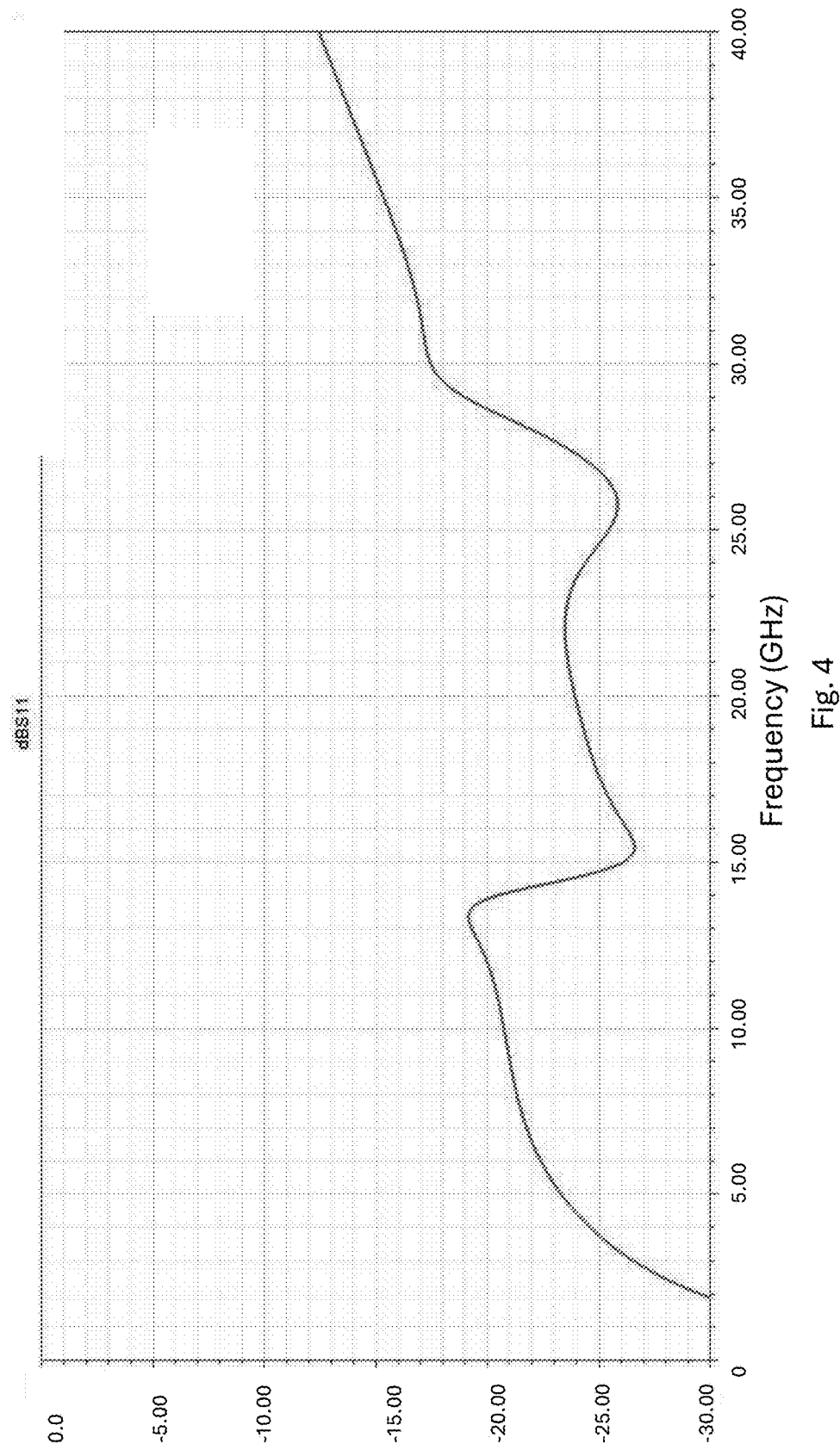
FIG. 4 plots the device's measured S11.

FIG. 4 illustrates the input return loss measured to be <20 dB to about 25 GHz, then rising to −10 dB at 40 GHz. Further optimization can improve the high frequency response.

Figure 5:
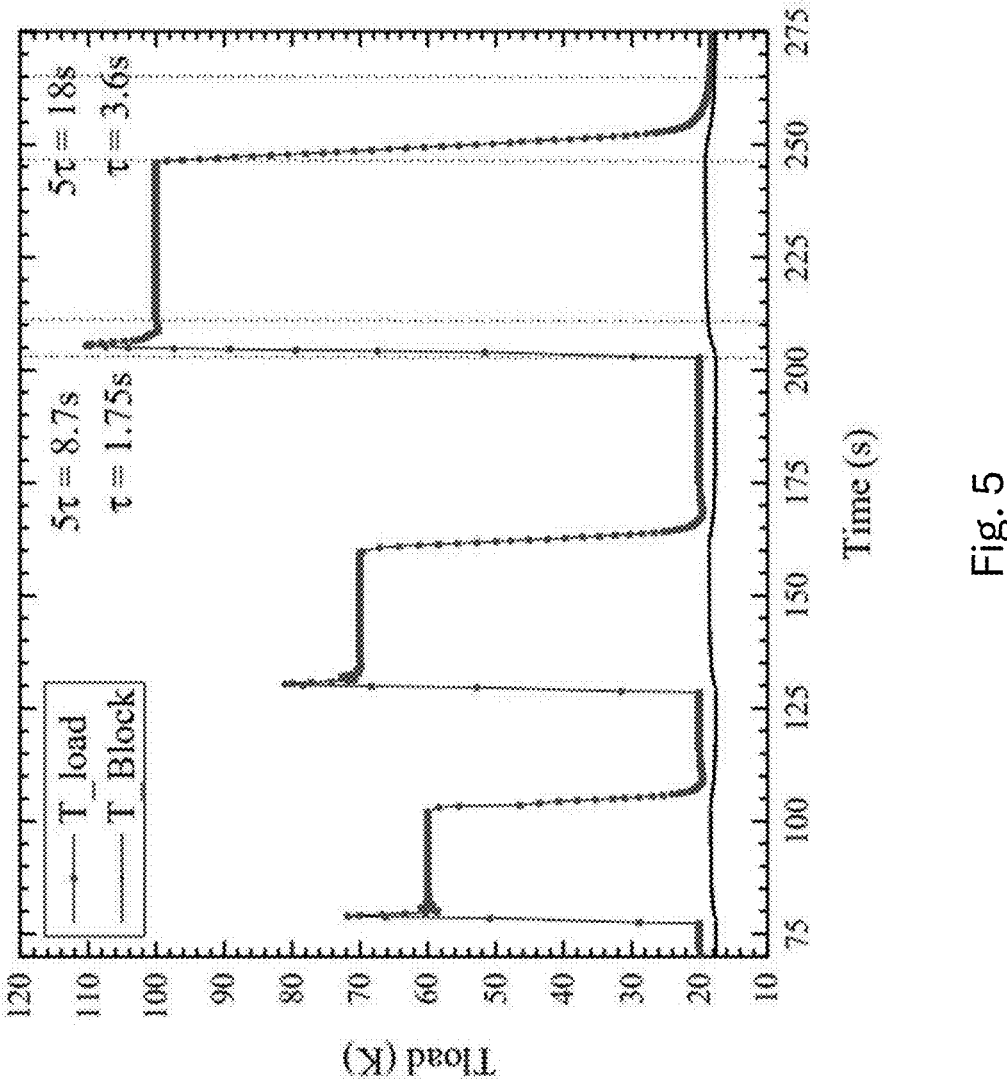
FIG. 5 plots the temperature of the load as a function of time, showing how quickly the temperature of the load can be changed.
Figures 6A, 6B:
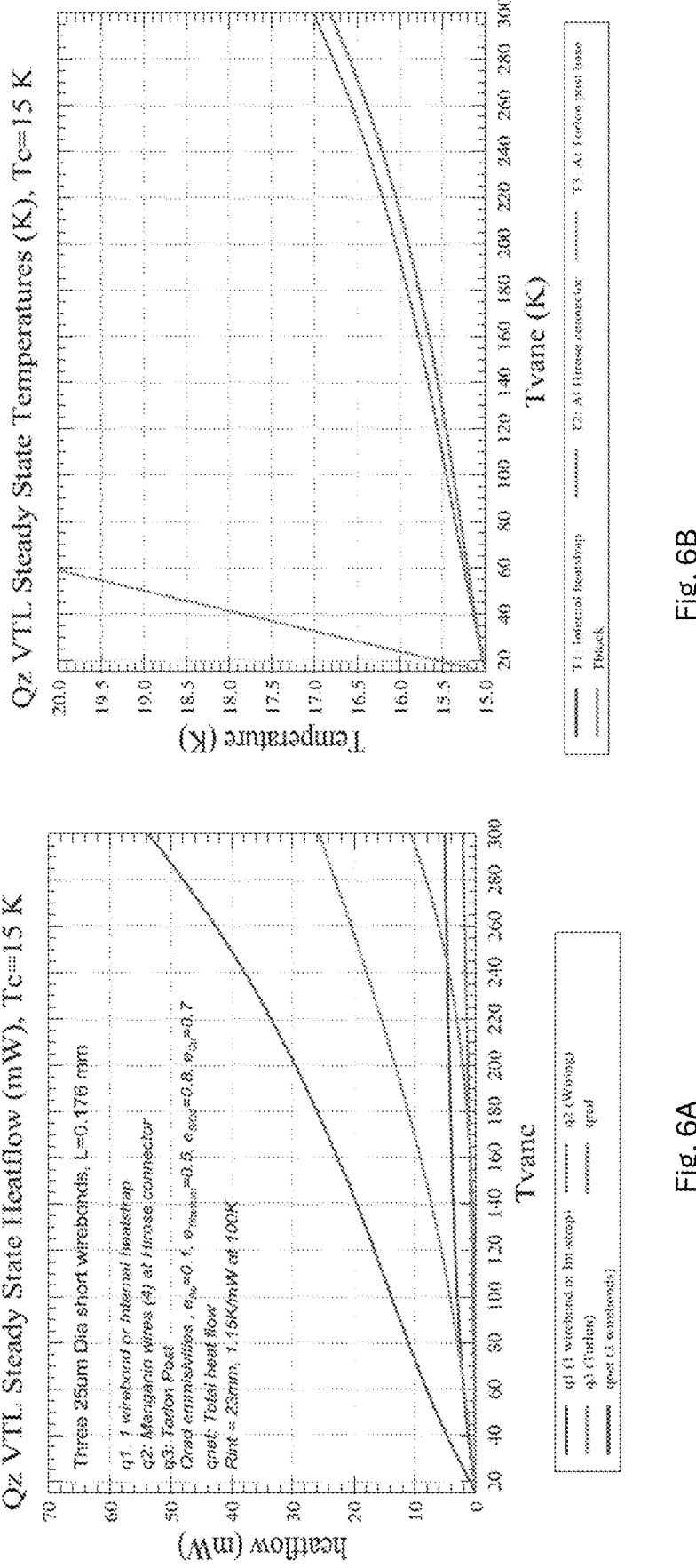
FIGS. 6A-6D plots heat flow and device temperature as a function of temperature of the vane at different locations of the device.
Figures 6C, 6D:
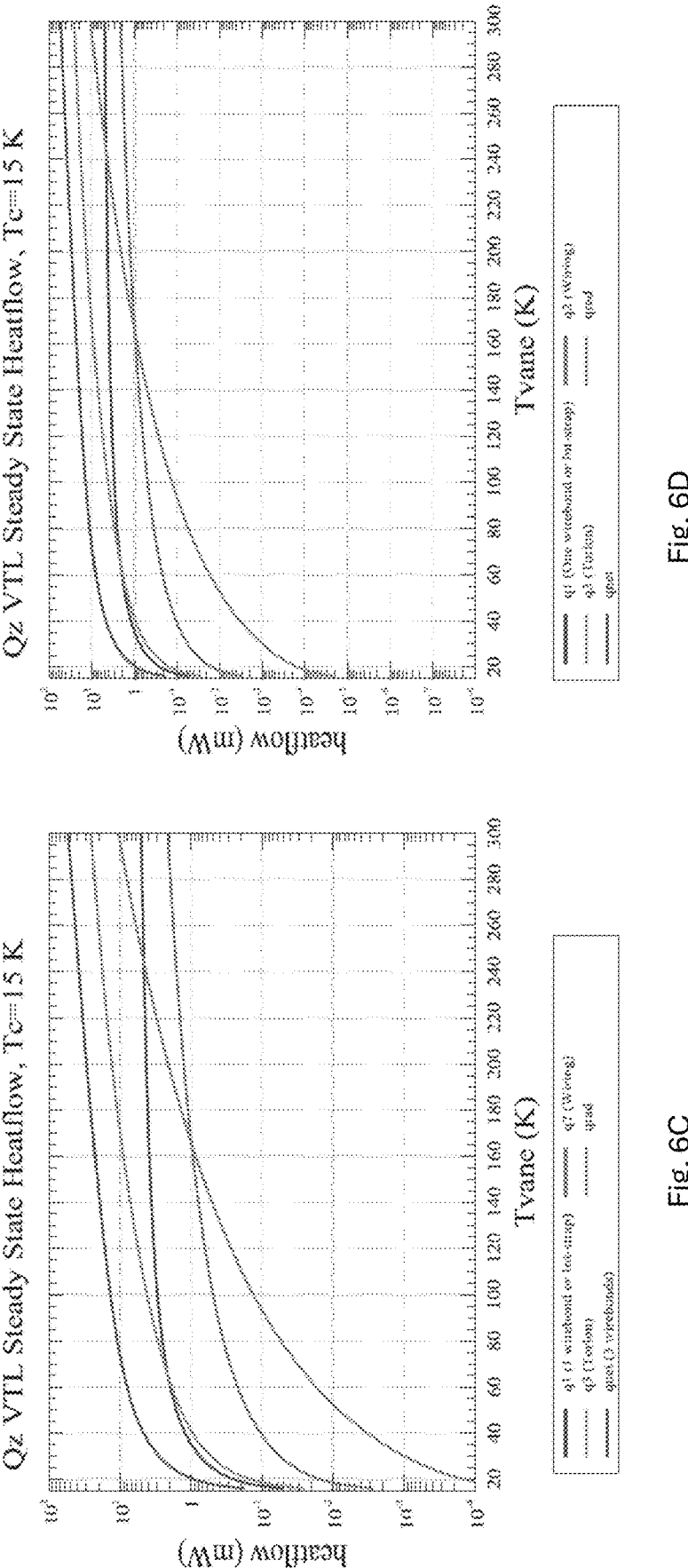
Figure 7A:
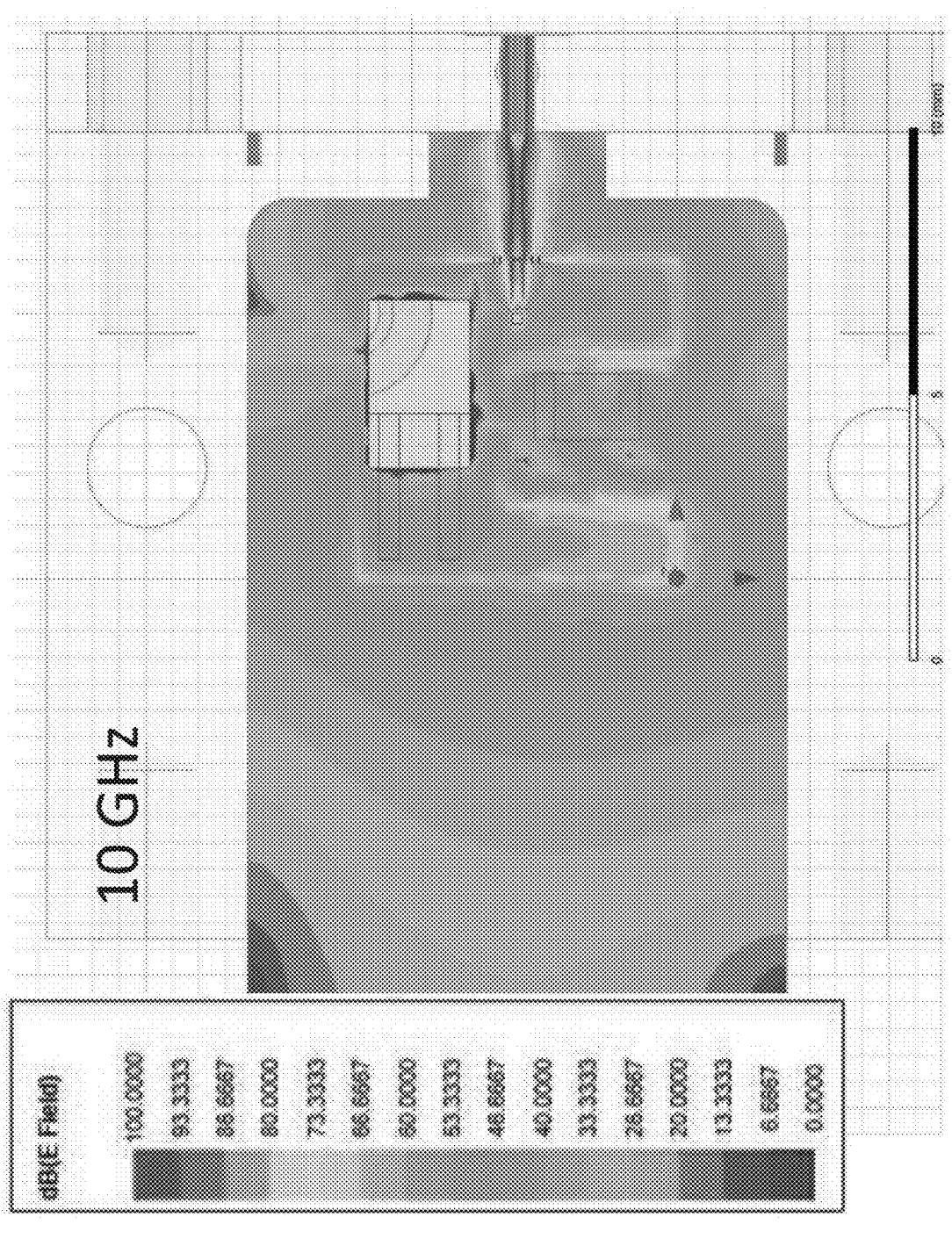
FIGS. 7A-7D. Maps the electric field strength across the device, showing the electric field strength in different views for 10 GHz (FIG. 7A), 25 GHz (FIG. 7B), 40 GHz (FIG. 7C) and 25 GHz with 3D view (FIG. 7D).
Figure 7B:
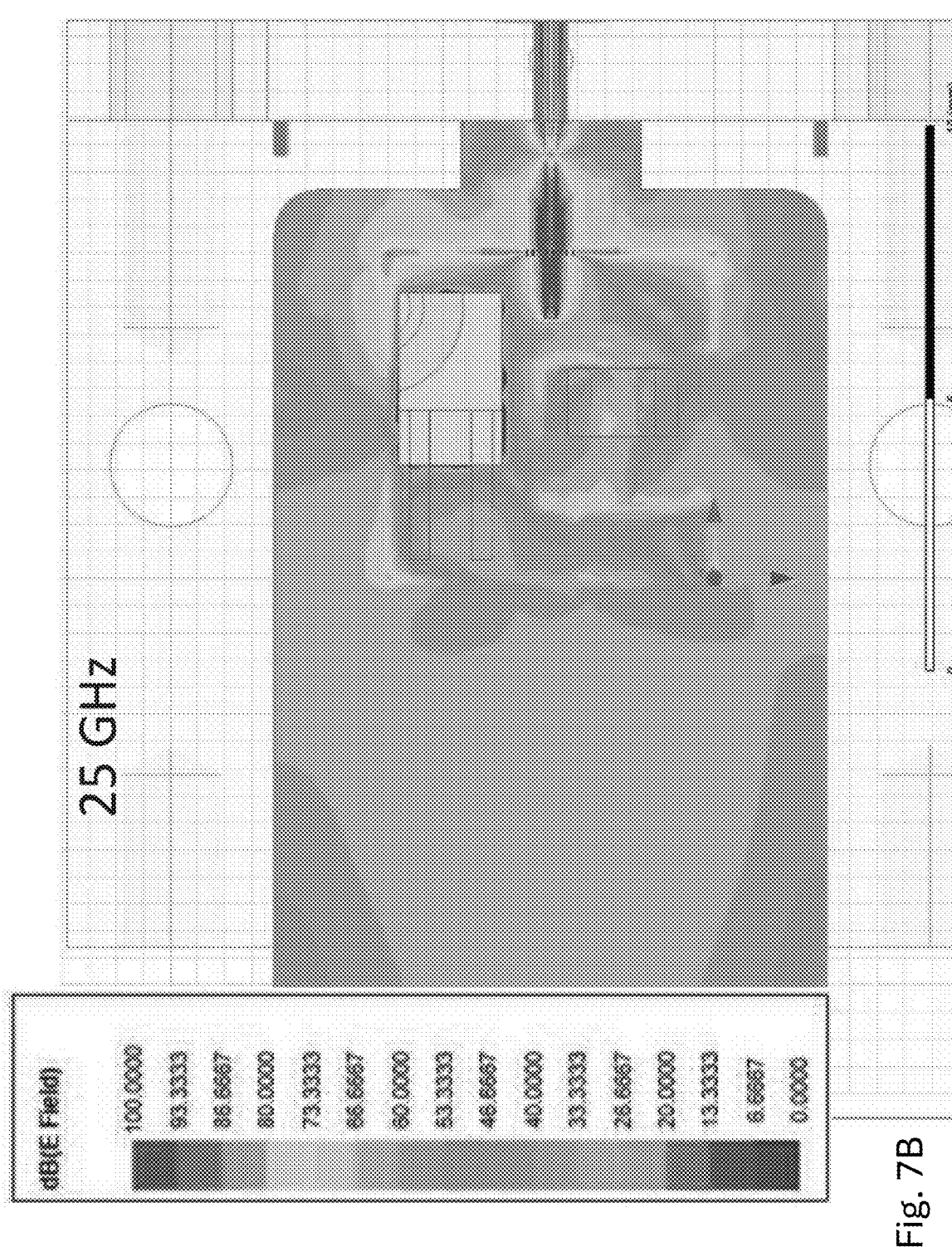
Figure 7C:
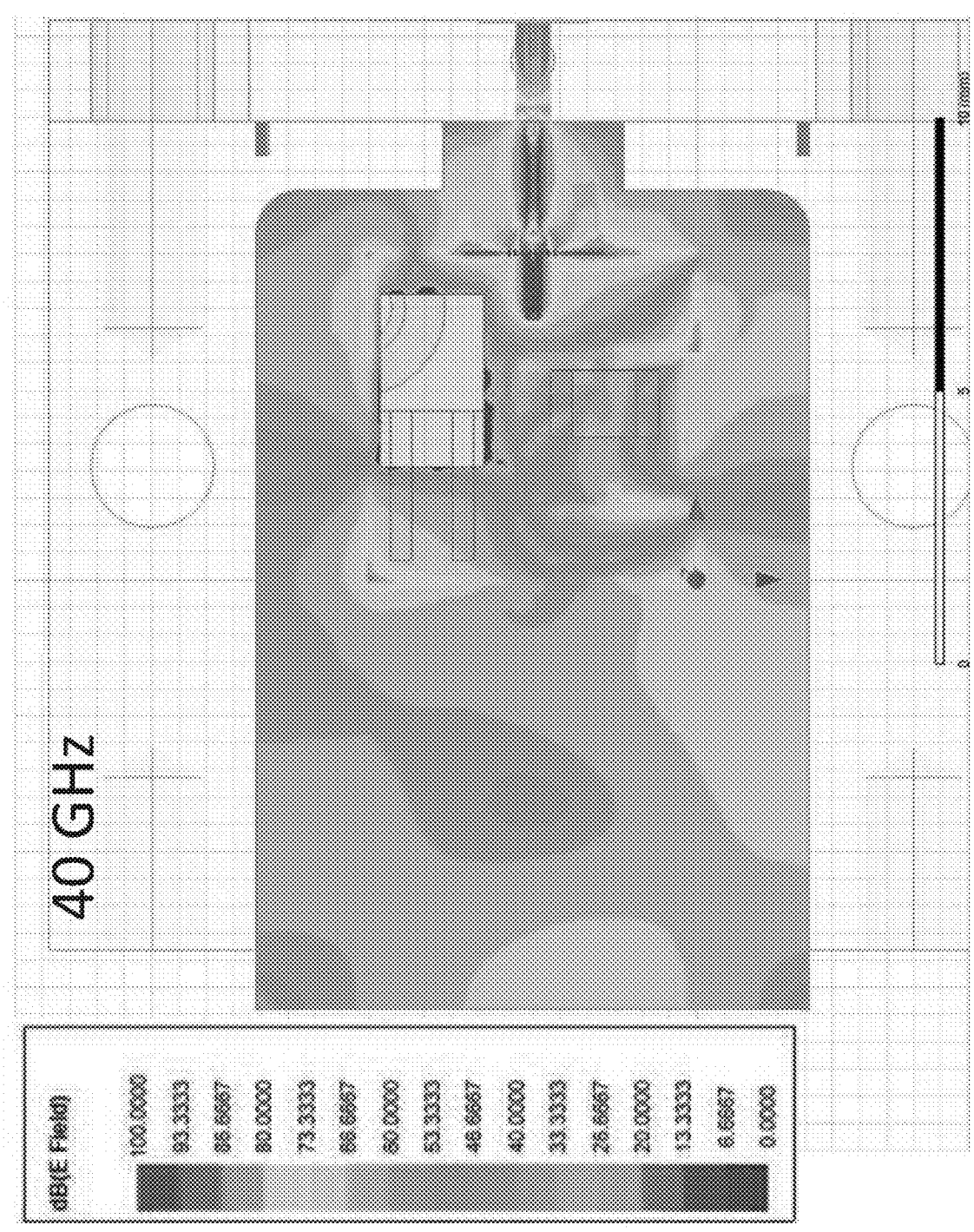
Figure 7D:
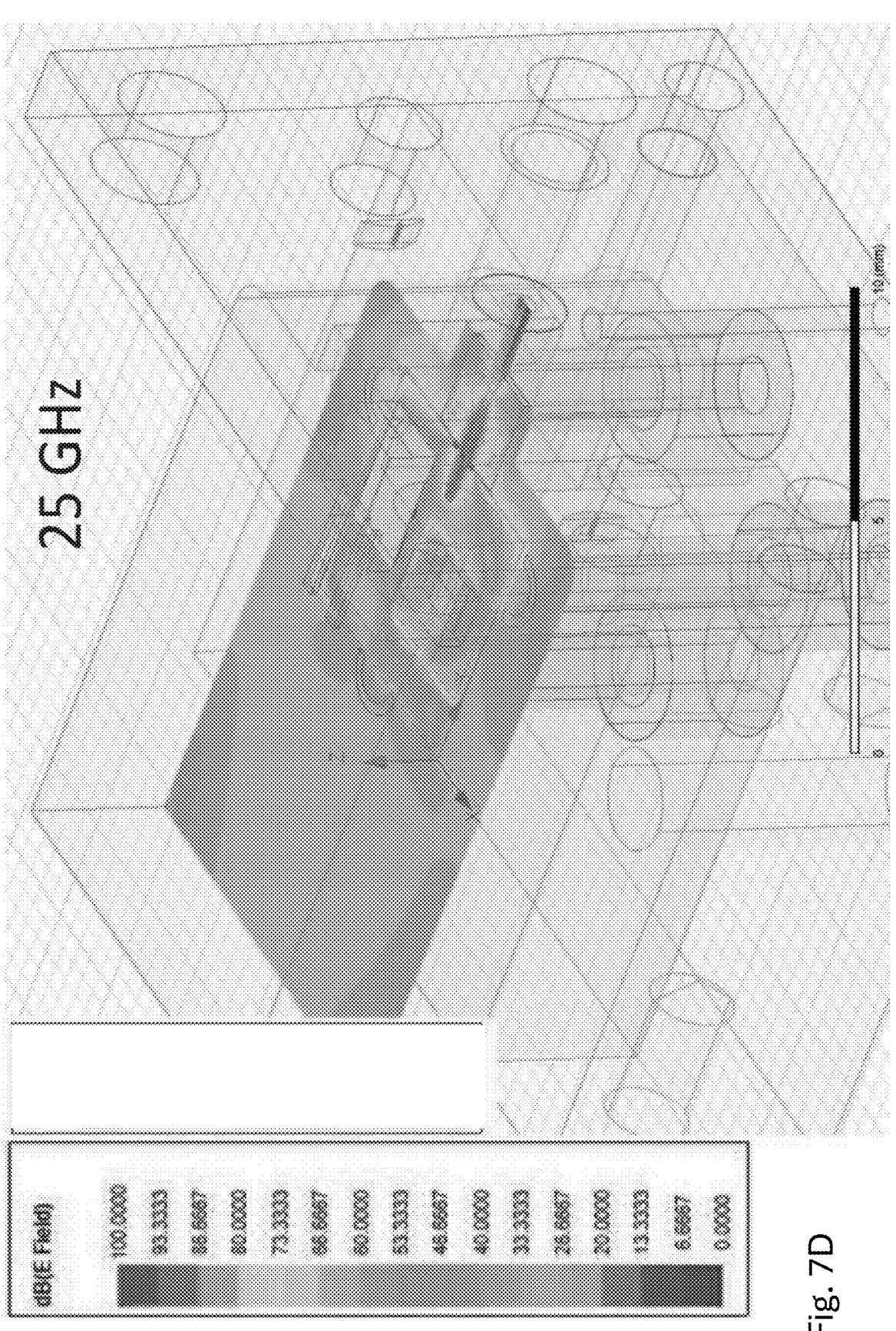

FIG. 5 illustrates the temporal response is excellent with a measured forced response from 4 K to 200 K in less than 4 seconds, e.g. a 1 tau time constant of less than 1 second.

FIGS. 6A-6D and 7a-7D illustrate heat flow and electric field strength of the device, respectively.

Example Noise Measurement

Figure 8:
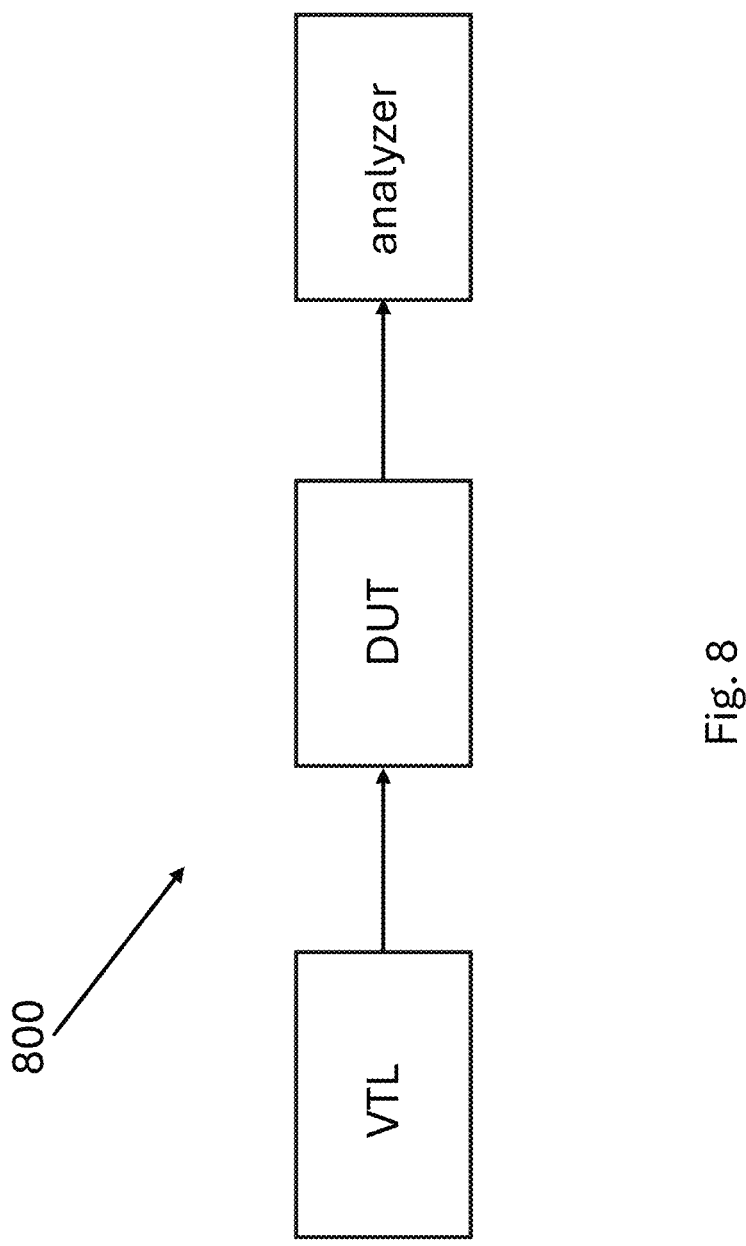
FIG. 8. System for measuring noise of a device under test.

FIG. 8 illustrates a system for measuring noise of a device under test (DUT), wherein an input to the device under test is connected to the coaxial connector of The VTL and the output of the DUT is connected to a spectrum analyzer. In typical embodiments, the VTL and the DUT (e.g., amplifier) are mounted in a cryostat capable of cooling to liquid helium temperatures.

A method for measuring the noise of the DUT comprises measuring a signal outputted from the DUT when the VTL is connected and when the VTL is disconnected from the DUT. The change in the signal when the VTL is connected (as compared to when the VTL is disconnected) can be used to determine the noise of the DUT.

Process Steps

Figure 9:
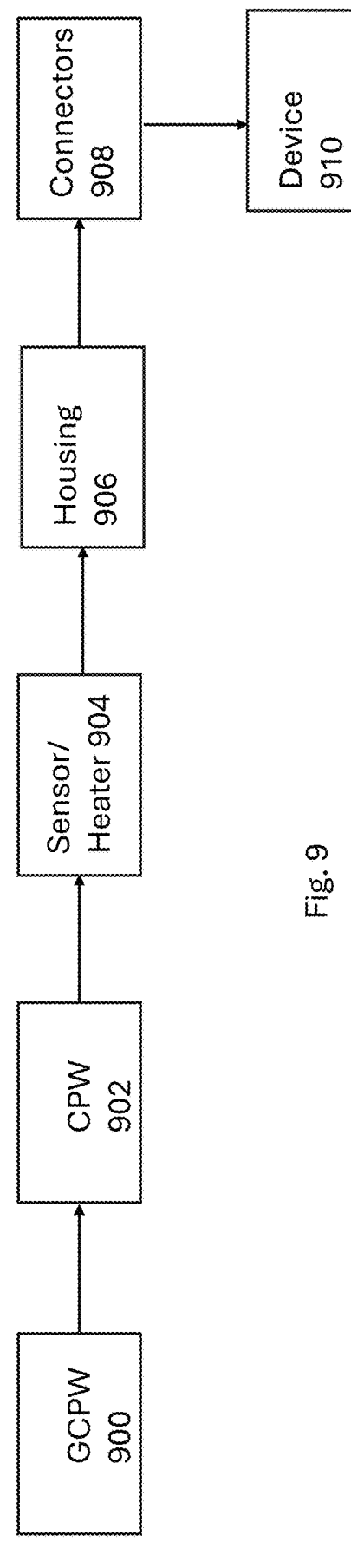
FIG. 9. Flowchart illustrating a method of making a noise source/VTL.

FIG. 9 illustrates a method of making a noise source or VTL according to one or more embodiments.

Block 900 represents fabricating (e.g., using photolithography) a grounded coplanar waveguide (GCPW) comprising a first metallization patterned on a first substrate, e.g., fused quartz substrate.

Block 902 represents fabricating (e.g., using photolithography) a CPW coupled to a 50 ohm termination comprising a second metallization patterned on a top surface of a second substrate, e.g., crystal quartz substrate. First and second metallization may comprise gold. Quartz for the first substrate and the second substrate was found to work best.

Block 904 represents depositing a temperature sensing diode and a heater resistor on the crystal quartz substrate.

Block 906 represents coupling the GCPW, CPW and their substrates in a metal housing/chassis. The metal housing can be fabricated by milling wall pieces, gold plating the wall pieces, and assembling the wall pieces with fasteners to form the housing. In one or more examples, the metal housing/ metal housing pieces comprise/consist of/consist essentially of gold plated brass.

Block 908 represents mounting the coaxial connector and diode and heater connectors.

Block 910 represents the end result, a noise source or VTL. Illustrative examples include, but are not limited to, the following.

1. A device 100, comprising:
  a variable temperature load (VTL) or noise source, comprising:
    a grounded coplanar waveguide (GCPW) comprising a first metallization 102 patterned on a first substrate 103 (e.g., comprising or consisting of or consisting essentially of a fused quartz substrate), the first metallization comprising a first end 105 for connecting to a coaxial connector 206 and a second end 107 for connecting to a coplanar waveguide (CPW);
    the CPW coupled to a 50 ohm termination 118 and comprising a second metallization 112 patterned on a top surface of a second substrate 114 (e.g., comprising, consisting of, or consisting essentially of a crystal quartz substrate);

a temperature sensor 126 (e.g., temperature sensing diode) thermally coupled to the second substrate (e.g., crystal quartz substrate) and the second metallization; and a heater resistor 122 coupled to the second substrate (e.g., crystal quartz substrate) via contact metallization.

2. The device of clause 1, wherein:

the first metallization comprises:

a first track 104 on a top side of the first substrate (e.g., fused quartz substrate), the first track comprising the first end for connecting to an inner conductor 250 of the coaxial connector 206 and a second end 107 for connecting to the coplanar waveguide (CPW);

a first ground conductor 106 and a second ground conductor 108 on the top surface and on either side of the first track;

a GCPW ground plane on a base side 252 of the first substrate (e.g., fused quartz substrate) for connecting to an outer conductor of the coaxial connector 206; and vias 110 through the first substrate (e.g., fused quartz substrate) electrically connecting the ground conductors 106, 108 to the GCPW ground plane; and the second metallization comprises a second track 116 and a CPW ground plane 120.

3. The device of clause 1 or 2, wherein the first ground conductor and the second ground conductor are closer to the second end 107 than the first end 105.

4. The device of any of the clauses 1-3, further comprising:

a metal housing/chassis 200 housing the GCPW, the CPW, the diode, and the resistor; wherein the GCPW ground plane is electrically coupled to and sits on the metal of the metal housing;

a thermal insulation 204 thermally de-coupling the second substrate (e.g., crystal quartz substrate) from the metal housing;

the coaxial connector 206 mounted to the metal housing and coupled to the first end of the GCPW and the GCPW ground plane; and a connector 208 comprising a first pair of terminals wired to the diode and a second pair of the terminals wired to the heater resistor.

5. The device of clause 4, wherein the thermal insulation comprises at least two stand off posts 204a supporting the second substrate (e.g., crystal quartz substrate) on a base of the housing.

6. The device of clause 5, wherein the standoff posts consist essentially of Torlon 4203 or polyamide-imide.

7. The device of any of the clauses 1-6, wherein the coaxial connector comprises a K-connector.

8. The device of any of the clauses 1-7, wherein the GCPW ground plane is not thermally coupled to the CPW ground plane.

9. The device of any of the clauses 1-8, wherein:

the first substrate (e.g., fused quartz substrate) and the second substrate (e.g., crystal quartz substrate) are separated by a small gap to allow electrical connection between first track of the GCPW and the second track of the CPW, and the small gap prevents electrical contact between the CPW ground plane and the GCPW ground plane and prevents thermal contact between the second substrate (e.g., crystal quartz substrate) and the first substrate (e.g., fused quartz substrate).

10. The device of any of the clauses 1-9, wherein the CPW and the GCPW are designed to transmit signals having a frequency in a range of DC to 40 GHz.

11. A system 800 for measuring noise of a device under test, comprising the device of any of the clauses 1-10, wherein an input to the device under test (DUT) is connected to the coaxial connector.

12. The system of clause 11, wherein the device and the device under test are mounted in a cryostat capable of cooling to liquid helium temperatures.

13. A method for measuring noise of a device under test, comprising:

connecting the device of any of the clauses 1-12 to an input of the device under test;

measuring a signal outputted from the device under test; and using the signal to determine the noise.

14. The method of clause 13, wherein the noise is measured using a temporal response of the device characterized as being less than 4 seconds across a temperature range from 4K to 200K.

15. The method or device of any of the clauses 1-14, wherein the noise is measured using an input return loss of the device characterized as being <−20 dB to about 25 GHz, then rising to no more than −10 dB at 40 GHz.

16. A package comprising the GCPW and CPW.

17. A method of making a device comprising a variable temperature load (VTL) or noise source, comprising:

fabricating a grounded coplanar waveguide (GCPW) comprising a first metallization patterned on a fused quartz substrate, the first metallization comprising a first end for connecting to a coaxial connector and a second end for connecting to a coplanar waveguide (CPW);

fabricating the CPW coupled to a 50 ohm termination and comprising a second metallization patterned on a top surface of a crystal quartz substrate;

thermally coupling a temperature sensing diode to the crystal quartz substrate and the second metallization; and coupling a heater resistor to the crystal quartz substrate via contact metallization; and coupling the CPW and the GCPW.

18. The method of clause 17 used to manufacture the device of any of the clauses 1-16.

References

The following references are incorporated by reference herein.

[1] J. W. Kooi et al., "A Programmable Cryogenic Waveguide Calibration Load With Exceptional Temporal Response and Linearity," in *IEEE Transactions on Terahertz Science and Technology*, vol. 8, no. 4, pp. 434-445, July 2018, doi: 10.1109/TTHZ.2018.2826838.

[2] W. R. McGrath, A. V. R"ais"anen, and P. L. Richards, "Variable-temperature loads for use in accurate noise measurements of cryogenically-cooled microwave amplifiers and mixers", Int. J. Infrared and Millimeter Waves, Vol. 7, No. 4, 1986.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A device, comprising:
a variable temperature load (VTL) or noise source, comprising:
a grounded coplanar waveguide (GCPW) comprising a first metallization patterned on a fused quartz substrate, the first metallization comprising a first end for connecting to a coaxial connector and a second end for connecting to a coplanar waveguide (CPW);
the CPW coupled to a 50 ohm termination and comprising a second metallization patterned on a top surface of a crystal quartz substrate;
a temperature sensing diode thermally coupled to the crystal quartz substrate and the second metallization; and
a heater resistor coupled to the crystal quartz substrate via contact metallization.

2. The device of claim 1, wherein:
the first metallization comprises:
a first track on a top side of the fused quartz substrate, the first track comprising the first end for connecting to an inner conductor of the coaxial connector and the second end for connecting to the coplanar waveguide (CPW);
a first ground conductor and a second ground conductor on the top surface and on either side of the first track;
a GCPW ground plane on a base side of the fused quartz substrate for connecting to an outer conductor of the coaxial connector; and
vias through the fused quartz substrate electrically connecting the ground conductors to the GCPW ground plane; and
the second metallization comprises a second track and a CPW ground plane.

3. The device of claim 2, wherein the first ground conductor and the second ground conductor are closer to the second end than the first end.

4. The device of claim 1, further comprising:
a metal housing housing the GCPW, the CPW, the diode, and the resistor; wherein a GCPW ground plane is electrically coupled to and sits on the metal of the metal housing;
a thermal insulation thermally de-coupling the crystal quartz substrate from the metal housing;
the coaxial connector mounted to the metal housing and coupled to the first end of the GCPW and the GCPW ground plane; and
a connector comprising a first pair of terminals wired to the diode and a second pair of the terminals wired to the heater resistor.

5. The device of claim 4, wherein the thermal insulation comprises at least two stand off posts supporting the crystal quartz substrate on a base of the housing.

6. The device of claim 5, wherein the standoff posts consist essentially of Torlon 4203 or polyamide-imide.

7. The device of claim 1, wherein the coaxial connector comprises a K-connector.

8. The device of claim 1, wherein the GCPW ground plane is not thermally coupled to the CPW ground plane.

9. The device of claim 2, wherein:
the fused quartz substrate and the crystal quartz substrate are separated by a small gap to allow electrical connection between the first track of the GCPW and the second track of the CPW, and the small gap prevents electrical contact between the CPW ground plane and the GCPW ground plane and prevents thermal contact between the crystal quartz substrate and the fused quartz substrate.

10. The device of claim 1, wherein the CPW and the GCPW are designed to transmit signals having a frequency in a range of DC to 40 GHz.

11. A system comprising the device of claim 1 for measuring noise of a device under test, wherein an input to the device under test is connected to the coaxial connector.

12. The system of claim 11, wherein the device and the device under test are mounted in a cryostat capable of cooling to liquid helium temperatures.

13. A method for measuring noise of a device under test, comprising:
connecting the device of any of the claims 1-12 to an input of the device under test;
measuring a signal outputted from the device under test; and
using the signal to determine the noise.

14. The method of claim 13, wherein the noise is measured using a temporal response of the device characterized as being less than 4 seconds across a temperature range from 4K to 200K.

15. The method of claim 13, wherein the noise is measured using an input return loss of the device characterized as being <−20 dB to about 25 GHZ, then rising to no more than −10 dB at 40 GHz.

16. A method of making a device comprising a variable temperature load (VTL) or noise source, comprising:
fabricating a grounded coplanar waveguide (GCPW) comprising a first metallization patterned on a fused quartz substrate, the first metallization comprising a first end for connecting to a coaxial connector and a second end for connecting to a coplanar waveguide (CPW);
fabricating the CPW coupled to a 50 ohm termination and comprising a second metallization patterned on a top surface of a crystal quartz substrate;
thermally coupling a temperature sensing diode to the crystal quartz substrate and the second metallization; and
coupling a heater resistor to the crystal quartz substrate via contact metallization; and
coupling the CPW and the GCPW.

17. The method of claim 16, wherein:
the fabrication comprises:
depositing the first metallization comprises:
a first track on a top side of the fused quartz substrate, the first track comprising the first end for connecting to an inner conductor of the coaxial connector and the second end for connecting to the coplanar waveguide (CPW);
a first ground conductor and a second ground conductor on the top surface and on either side of the first track; and
a GCPW ground plane on a base side of the fused quartz substrate for connecting to an outer conductor of the coaxial connector; and
forming vias through the fused quartz substrate electrically connecting the ground conductors to the GCPW ground plane; and
depositing the second metallization comprising a second track and a CPW ground plane.

18. The method of claim 17, wherein the first ground conductor and the second ground conductor are closer to the second end than the first end.

19. The method of claim 17, further comprising:

housing the GCPW, the CPW, the diode, and the resistor in a metal housing;

wherein the GCPW ground plane is electrically coupled to and sits on the metal of the metal housing;

providing a thermal insulation thermally de-coupling the crystal quartz substrate from the metal housing;

mounting the coaxial connector to the metal housing and coupled to the first end of the GCPW and the GCPW ground plane; and providing a connector comprising a first pair of terminals wired to the diode and a second pair of the terminals wired to the heater resistor.

20. The method of claim 19, wherein the thermal insulation comprises at least two stand off posts supporting the crystal quartz substrate on a base of the housing and the standoff posts consist essentially of Torlon 4203 or polyamide-imide.

* * * * *